US012125649B2

(12) United States Patent
Usui

(10) Patent No.: US 12,125,649 B2
(45) Date of Patent: Oct. 22, 2024

(54) ELECTRICAL APPLIANCE

(71) Applicant: ROHM CO., LTD., Kyoto (JP)

(72) Inventor: Hirotoshi Usui, Kyoto (JP)

(73) Assignee: ROHM CO., LTD, Kyoto (JP)

( * ) Notice: Subject to any disclaimer, the term of this patent is extended or adjusted under 35 U.S.C. 154(b) by 0 days.

(21) Appl. No.: 18/070,620

(22) Filed: Nov. 29, 2022

(65) Prior Publication Data

US 2023/0090361 A1    Mar. 23, 2023

Related U.S. Application Data

(63) Continuation of application No. PCT/JP2021/018087, filed on May 12, 2021.

(30) Foreign Application Priority Data

May 29, 2020   (JP) ................................. 2020-094579

(51) Int. Cl.
| | | |
|---|---|---|
| *H01H 13/14* | (2006.01) | |
| *F24C 7/08* | (2006.01) | |
| *G06F 3/02* | (2006.01) | |
| *H01H 19/14* | (2006.01) | |
| *H05B 6/64* | (2006.01) | |

(52) U.S. Cl.
CPC .......... *H01H 13/14* (2013.01); *G06F 3/0202* (2013.01); *H01H 19/14* (2013.01); *F24C 7/082* (2013.01); *H05B 6/6435* (2013.01)

(58) Field of Classification Search
CPC . H05B 6/64; H05B 6/6435; F24C 7/08; F24C 7/081; H01H 13/14; H01H 19/14; H01H 2003/0293; H01H 2003/127; H01H 1/06; H01H 9/00; H01H 9/02; H01H 13/50; H01H 13/70; H01H 13/7006; H01H 13/702; H01H 2071/048; H01H 2221/00; H01H 2221/004; H01H 2223/01; H01H 2223/02; H01H 2223/036; H01H 2231/012; H01H 2231/016; H01H 2239/006; H01H 2239/074; G06F 3/02; G06F 3/0202
See application file for complete search history.

(56) References Cited

FOREIGN PATENT DOCUMENTS

| | | |
|---|---|---|
| JP | S50091775 A | 7/1975 |
| JP | S56104036 U1 | 8/1981 |
| JP | 2013196866 A | 9/2013 |
| JP | 2016040325 A | 3/2016 |
| JP | 2016100302 A | 5/2016 |
| JP | 2019016264 A | 1/2019 |

OTHER PUBLICATIONS

International Search Report for International Application No. PCT/JP2021/018087; Date of Mailing, Jul. 27, 2021.
PCT International Preliminary Report on Patentability for International Application No. PCT/JP2021/018087; Date of Mailing, Nov. 17, 2022; with Written Opinion of the International Searching Authority; Date of Mailing, Jul. 27, 2021.
JPO Notification of Reason(s) for Refusal for corresponding JP Application No. 2022-526869; Issued Sep. 3, 2024.

*Primary Examiner* — Anthony R Jimenez
(74) *Attorney, Agent, or Firm* — CANTOR COLBURN LLP

(57) ABSTRACT

An operation panel is provided on a vertical surface of an electrical appliance. The operation panel is provided with an operation surface having an uneven structure. A thin switch is provided in a recess portion of the operation surface.

8 Claims, 13 Drawing Sheets

ELECTRICAL APPLIANCE

CROSS REFERENCE TO RELATED APPLICATIONS

This application is a continuation under 35 U.S.C. § 120 of PCT/JP2021/018087 filed May 12, 2021, which is incorporated herein by reference, and which claimed priority to Japanese Application No. 2020-094579, filed May 29, 2020. The present application likewise claims priority under 35 U.S.C. § 119 to Japanese Application No. 2020-094579, filed May 29, 2020, the entire content of which is also incorporated herein by reference.

BACKGROUND

1. Technical Field

The present disclosure relates to an electrical appliance.

2. Description of the Related Art

Electrical appliances such as microwaves, refrigerators, washing machines, etc., are provided with switches (buttons) as a user interface.

Conventional electrical appliances employ a membrane switch having a contact that is mechanically displaced according to a user's touch. From the structural viewpoint, such a membrane switch has a certain thickness, leading to irregularities on the surface of an electrical appliance. In recent years, instead of such membrane switches, an increasing number of products employ capacitive switches, resistor film switches, or the like (which will be collectively referred to as "thin switches" hereafter).

As a result of investigating the operation sensation of thin switches in electrical appliances, the present inventor has come to recognize the following problem.

FIG. 1A and FIG. 1B are diagrams for explaining the operation of a switch by a user with short fingernails. FIG. 1A shows a switch SW1 provided on a horizontal surface 2 of an electrical appliance. FIG. 1B shows a switch SW2 provided on a vertical surface 4 of the electrical appliance. As shown in FIG. 1A and FIG. 1B, such an arrangement allows a user with short fingernails to operate the thin switch by touch without a sensation of discomfort regardless of whether the thin switch is provided on the horizontal surface 2 or the vertical surface 4.

FIG. 2A through FIG. 2C are diagrams for explaining the operation of a switch by a user with long fingernails. FIG. 2A shows the switch SW1 provided on a horizontal surface 2 of an electrical appliance. FIG. 2B and FIG. 2C each show the switch SW2 provided on a vertical surface 4 of the electrical appliance.

As shown in FIG. 2A, in a case in which the thin switch is provided on the horizontal surface 2, this allows a user to perform a touch operation without a sensation of discomfort even if the user has long fingernails. However, in a case in which the thin switch is provided on the vertical surface 4 as shown in FIG. 2B, the user's fingernail comes in contact with the panel surface. Accordingly, it is difficult for the user to press the switch SW2. For a user with long fingernails to accurately operate the switch SW2, as shown in FIG. 2C, the index finger must be approximately parallel to the vertical surface 4. This requires bending the wrist significantly ($\theta$ becomes large). This means that the user consciously or unconsciously adopts an unnatural posture.

SUMMARY

The present disclosure has been made in view of such a situation.

An embodiment of the present disclosure relates to an electrical appliance. The electrical appliance includes: a vertical surface; and an operation panel provided on the vertical surface. The operation panel includes: an operation surface having an uneven structure; and a thin switch provided on a protrusion portion of the operation surface.

An embodiment of the present disclosure relates to an electrical appliance. The electrical appliance includes: a vertical surface; and an operation panel provided on the vertical surface. The operation panel includes: a base member provided such that it protrudes from the vertical surface; multiple electrodes arranged with intervals in a touch region on a side surface of the base member; and a recess portion formed in the vertical surface such that it corresponds to the touch region of the base member.

It is to be noted that any arbitrary combination or rearrangement of the above-described structural components and so forth is effective as and encompassed by the present embodiments. Moreover, all of the features described in this summary are not necessarily required by embodiments so that the embodiment may also be a sub-combination of these described features. In addition, embodiments may have other features not described above.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Outline of Embodiments

Figure 1A:
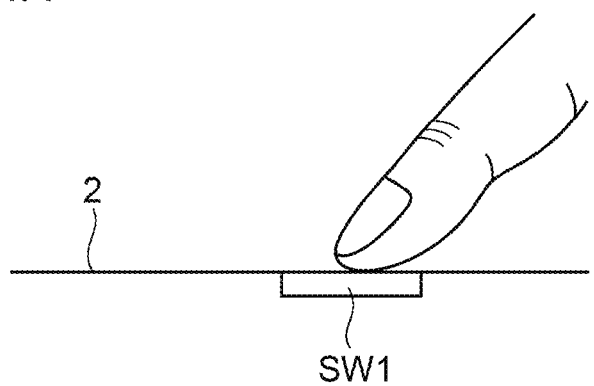
FIG. 1A and FIG. 1B are diagrams for explaining the operation of a switch by a user with short fingernails.

An outline of several example embodiments of the disclosure follows. This outline is provided for the convenience of the reader to provide a basic understanding of such embodiments and does not wholly define the breadth of the disclosure. This outline is not an extensive overview of all contemplated embodiments and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "one embodiment" may be used herein to refer to a single embodiment or multiple embodiments of the disclosure.

An electrical appliance according to one embodiment includes: a vertical surface; and an operation panel provided on the vertical surface. The operation panel includes: an operation surface having an uneven structure; and a thin switch provided on a protrusion portion of the operation surface.

With this arrangement, when a user with long fingernails touches the thin switch provided to the protrusion portion, the tip of the fingernail is positioned in the recess portion, thereby allowing a sensation of discomfort to be reduced.

In one embodiment, the bottom surface of a recess portion of the uneven structure may substantially match a main front surface of the electrical appliance.

In one embodiment, the top surface of a protrusion portion of the uneven structure may substantially match a main front surface of the electrical appliance.

In one embodiment, a touch portion of the thin switch may be provided on the top surface of the protrusion portion.

In one embodiment, a touch portion of the thin switch may be provided on a slope surface of the protrusion portion.

In one embodiment, the thin switch may be structured as a capacitive switch having a sense electrode embedded on a back side of the operation surface.

An electrical appliance according to one embodiment includes: a vertical surface; and an operation panel provided on the vertical surface. The operation panel includes: a base member provided such that it protrudes from the vertical surface; multiple electrodes arranged with intervals in a touch region on a side surface of the base member; and a recess portion formed in the vertical surface such that it corresponds to the touch region of the base member.

The multiple electrodes may be configured to form a slide switch or a rotary switch. With this arrangement, when a user with long fingernails slides a finger along the side surface of the base member, the tip of the fingernail is positioned in the recess portion, thereby allowing a sensation of discomfort to be reduced.

EMBODIMENTS

Description will be made below regarding preferred embodiments with reference to the drawings. In each drawing, the same or similar components, members, and processes are denoted by the same reference numerals, and redundant description thereof will be omitted as appropriate. The embodiments have been described for exemplary purposes only and are by no means intended to restrict the present disclosure and the present invention. Also, it is not necessarily essential for the present disclosure and the present invention that all the features or a combination thereof be provided as described in the embodiments.

In the present specification, the state represented by the phrase "the member A is coupled to the member B" includes a state in which the member A is indirectly coupled to the member B via another member that does not substantially affect the electric connection between them, or that does not damage the functions or effects of the connection between them, in addition to a state in which they are physically and directly coupled.

Similarly, the state represented by the phrase "the member C is provided between the member A and the member B" includes a state in which the member A is indirectly coupled to the member C, or the member B is indirectly coupled to the member C via another member that does not substantially affect the electric connection between them, or that does not damage the functions or effects of the connection between them, in addition to a state in which they are directly coupled.

Figure 3:
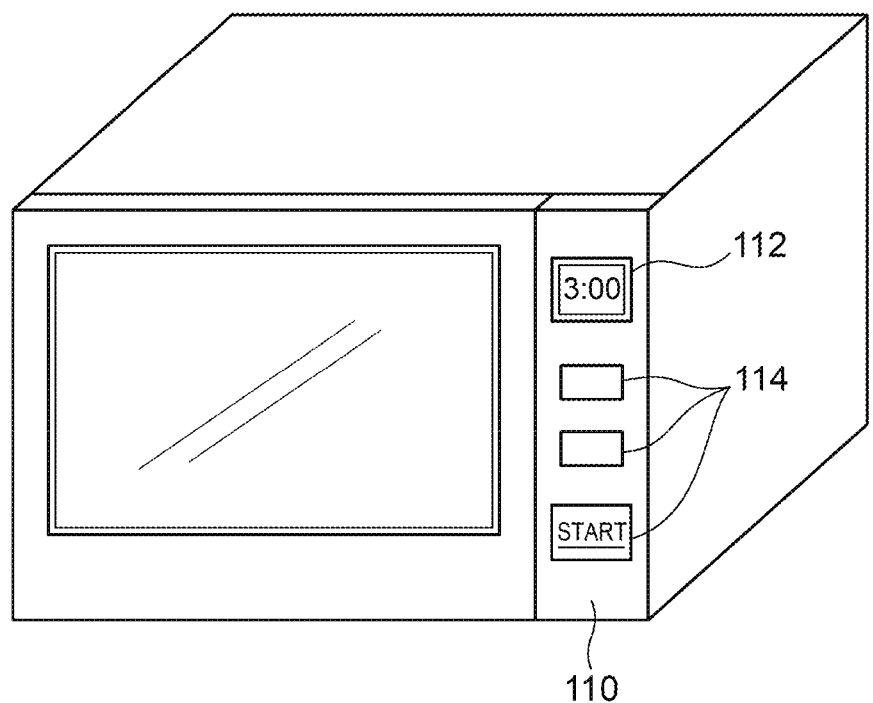
FIG. 3 is a perspective diagram showing an external view of an electrical appliance.

FIG. 3 is a perspective diagram showing an external view of an electrical appliance 100. In the present embodiment, the electrical appliance 100 is configured as a microwave, oven, toaster oven, or the like. The electrical appliance 100 is provided with an operation panel 110 configured as a user interface. The operation panel 110 is provided on a vertical surface. The operation panel 110 is provided with a liquid crystal panel 112, multiple switches 114, etc.

Embodiment 1

Figure 4:
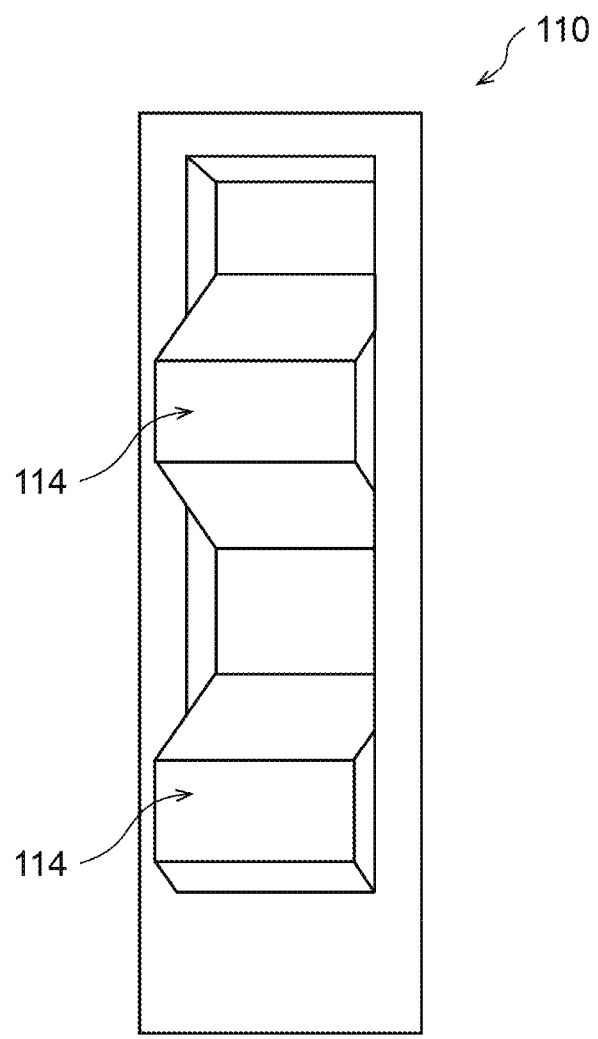
FIG. 4 is a perspective diagram showing an operation panel according to an embodiment 1.
Figure 5:
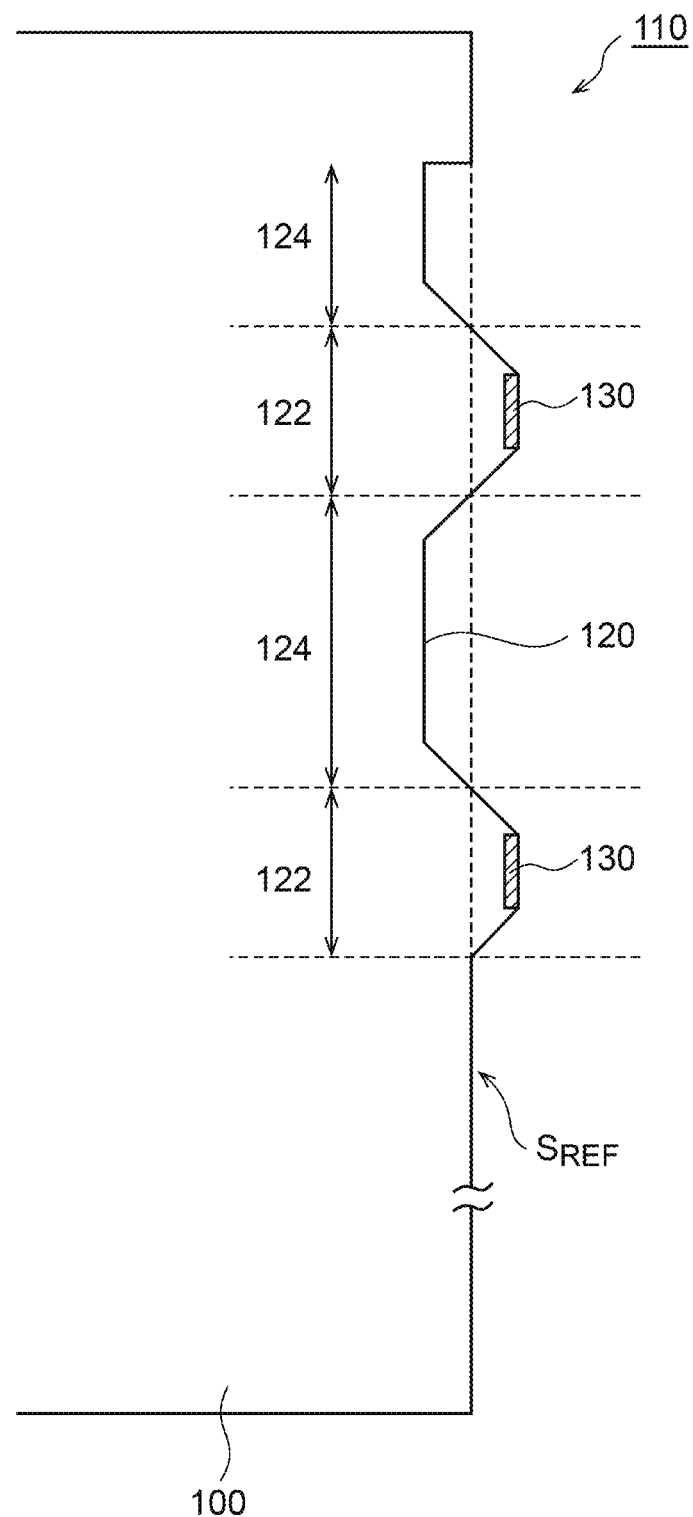
FIG. 5 is a cross-sectional diagram showing the operation panel shown in FIG. 4.

FIG. 4 is a perspective diagram showing the operation panel 110 according to an embodiment 1. The operation panel 110 is provided with two switches 114 arranged side by side in the vertical direction. FIG. 5 is a cross-sectional view of the operation panel 110 shown in FIG. 4. In the drawing, the left side corresponds to the main body of the electrical appliance 100, and the right side corresponds to a space where the user is. The operation panel 110 includes an operation surface 120 and one or multiple thin switches 130. The operation surface 120 has an uneven structure. Each thin switch 130 is provided to a protrusion portion 122 of the operation surface 120. A recess portion 124 is formed in a region adjacent to the upper side of the protrusion portion 122. It should be noted that the boundary between the protrusion portion 122 and the recess portion 124 is defined for convenience. In FIG. 5, a region on the user side (right side) of an arbitrary reference surface $S_{REF}$ will be referred to as the "protrusion portion 122", and a region on the main body side (left side) thereof will be referred to as the "recess portion 124".

The thin switch 130 is configured as a capacitive switch, resistor film switch, membrane switch, pressure-sensitive switch, or the like, which is provided to the protrusion portion 122 of the operation surface 120.

Figure 1B:
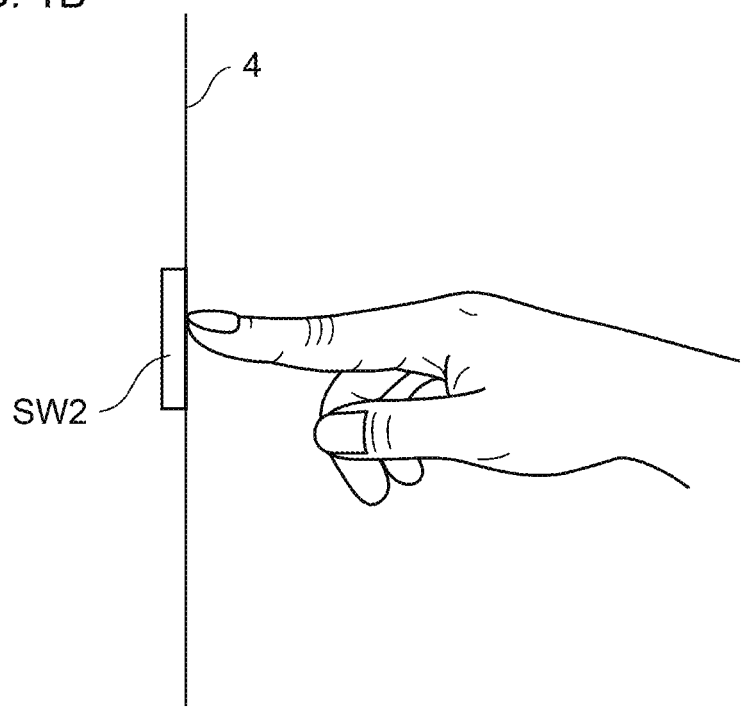
Figure 6B:
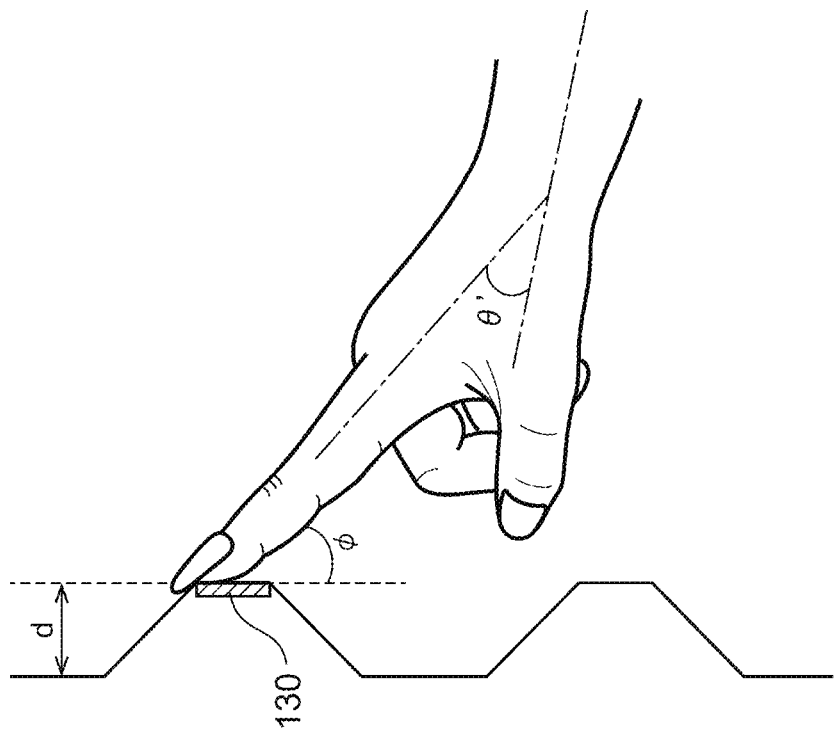
FIG. 6A and FIG. 6B are diagrams for explaining the operation of the operation panel shown in FIG. 5.
Figure 6A:
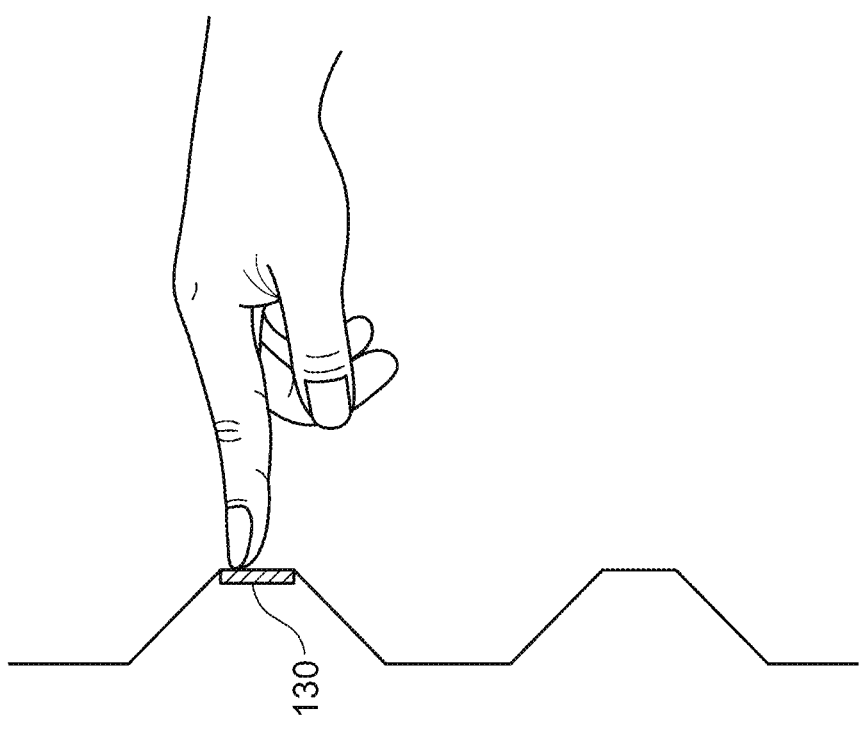

The above is the configuration of the electrical appliance 100. FIG. 6A and FIG. 6B are diagrams for explaining the operation of the operation panel 110 shown in FIG. 5. FIG. 6A shows an operation by a user with short fingernails. This is capable of providing the same operational sensation as that shown in FIG. 1B.

Figure 2A:
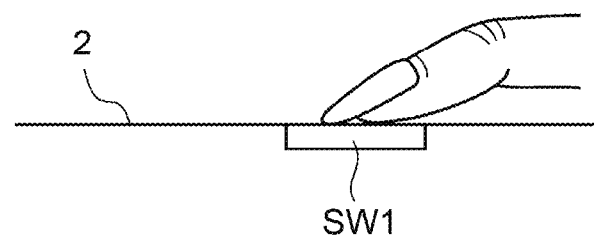
FIG. 2A through FIG. 2C are diagrams for explaining the operation of a switch by a user with long fingernails.
Figure 2B:
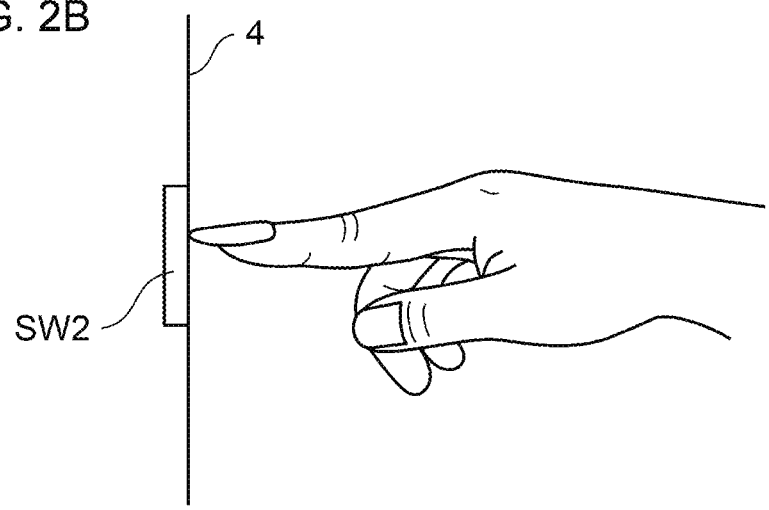
Figure 2C:
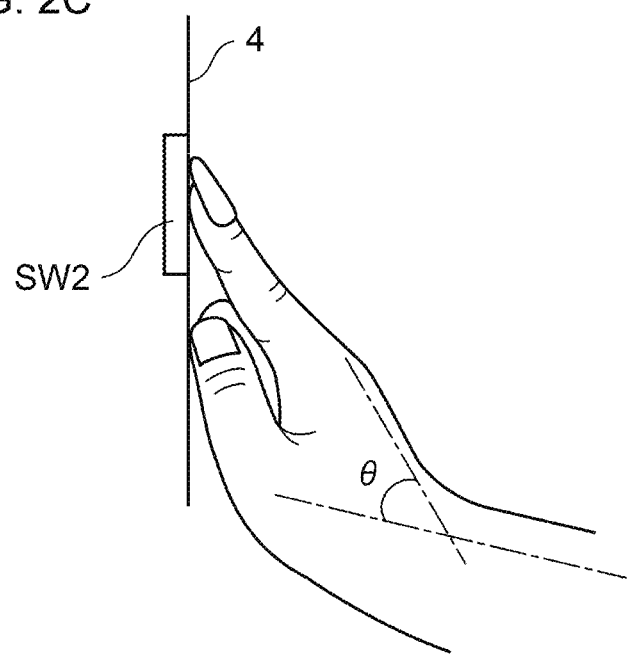

FIG. 6B shows an operation by a user with long fingernails. In this case, the user's fingernail is positioned in the recess portion. Accordingly, as compared with the configuration shown in FIG. 2C, the finger can be positioned such that it is approximately perpendicular to the surface of the operation panel. This allows the bending angle θ' of the user's wrist to be reduced as compared with the bending angle θ shown in FIG. 2C, thereby providing an improved operation sensation.

Figure 7:
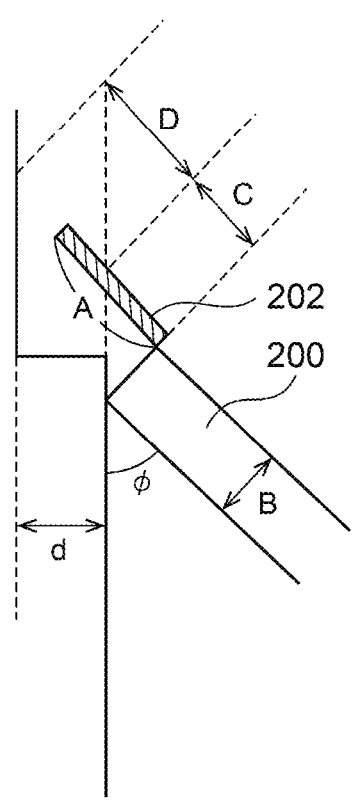
FIG. 7 is a diagram showing a simplified model of a finger.

It should be noted that the depth (height) d of the uneven structure may preferably be determined such that the tip of the fingernail does not come in contact with the bottom surface of the recess portion 124 of the operation surface 120. FIG. 7 is a diagram showing a simplified model of a finger 200. The required depth d of the uneven structure can be geometrically calculated with the length of a fingernail 202 as "A", with the thickness of the finger 200 as "B", and with the angle defined between the finger 200 and the vertical surface as φ.

$$C = B/\tan \phi$$

$$D = d/\sin \phi$$

The condition that ensures that the tip of the fingernail does not come in contact with the bottom surface is represented by C+D>A.

$$B/\tan \phi + d/\sin \phi > A$$

$$d > (A - B/\tan \phi) \times \sin \phi$$

Description will be made assuming that A=10 mm and B=10 mm. In a range of φ<45°, the relation A<C holds true. In this case, the depth d is not required.

In a case in which φ=50°, the condition d>1.23 mm holds true. In a case in which φ=70°, the condition d>5.98 mm holds true. As described above, as φ becomes larger, the required depth of the groove becomes larger. In other words, as the protrusion/recess height difference d becomes larger, the allowed angle φ becomes larger, thereby allowing the angle θ' of the user's wrist to be reduced.

Figure 8A:
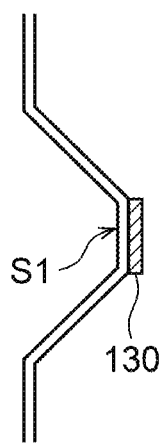
FIG. 8A through FIG. 8D are cross-sectional diagrams each showing a specific example of the operation panel.
Figure 8B:
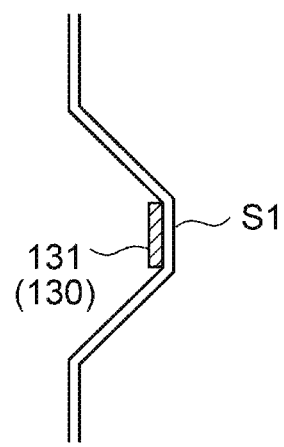

Next, description will be made regarding a specific example configuration of the operation panel 110. FIGS. 8A through 8E are cross-sectional diagrams each showing a specific example of the operation panel 110. FIGS. 8A and 8B each show an arrangement in which the thin switch 130 is provided on an upper surface S1 of the protrusion portion 122. In a case in which the thin switch 130 is configured as a capacitive switch, the sensor electrode 131 may be embedded in the back side of the operation surface 120 as shown in FIG. 8B.

Figure 8C:
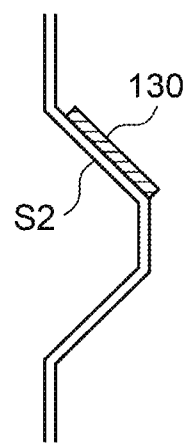
Figure 8D:
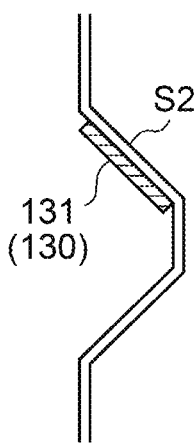

FIG. 8C and FIG. 8D each show an arrangement in which the thin switch 130 is provided on an upper-side slope S2 of the protrusion portion 122. In a case in which the thin switch 130 is configured as a capacitive switch, as shown in FIG. 8D, the sensor electrode 131 may be provided on the back side of the operation surface 120.

In a case in which the thin switch 130 is configured as a capacitive switch, as shown in FIG. 8E, the sensor electrode 131 may be provided at a deep position on the back side of the protrusion portion 122.

Figure 9A:
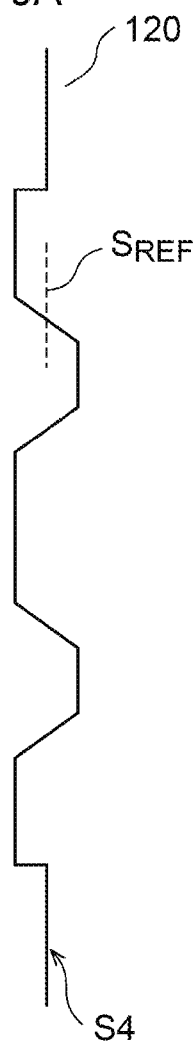
FIG. 9A through FIG. 9C are diagrams each showing a variation of an uneven structure of the operation surface.
Figure 9B:
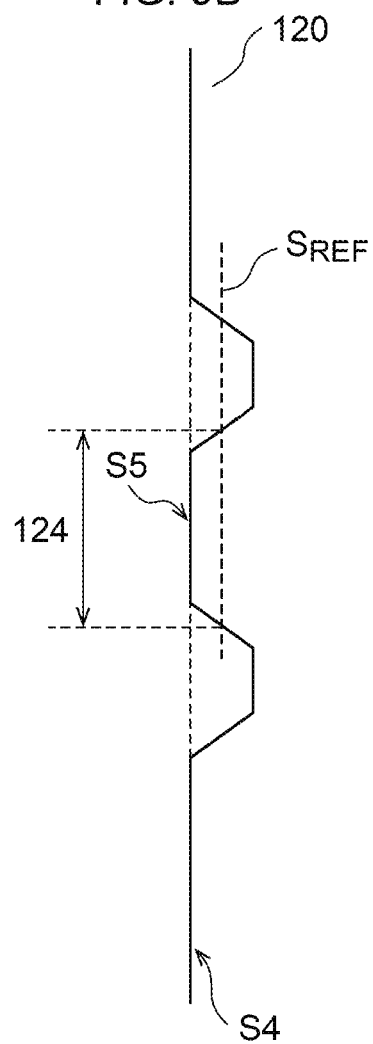
Figure 9C:
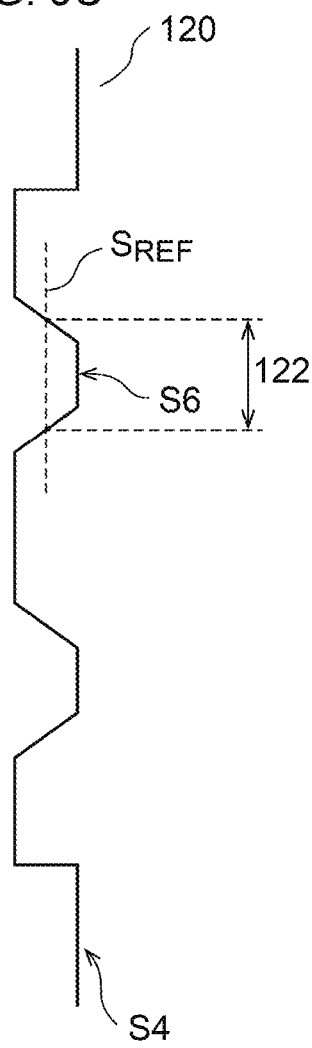

FIG. 9A through FIG. 9C are diagrams each showing a variation of the uneven structure of the operation surface 120. In FIG. 9A through FIG. 9C, S4 indicates the main front surface of the electrical appliance 100. The main front surface S4 can be regarded as a surface of a portion other than the operation panel 110 shown in FIG. 3.

The operation surface 120 shown in FIG. 9A has the main front surface S4 that matches the reference surface $S_{REF}$. That is to say, the operation surface 120 has a protrusion portion and a recess portion with respect to the main front surface S4.

The operation surface 120 shown in FIG. 9B has the main front surface S4 that substantially matches the bottom surface S5 of the recess portion 124. That is to say, the reference surface $S_{REF}$ that defines the boundary between the protrusion portion 122 and the recess portion 124 is positioned on the front side (right side in the drawing) as compared with the main front surface S4. With respect to the main front surface S4, the operation surface 120 has a protrusion at a position at which the thin switch 130 is provided.

The operation surface 120 shown in FIG. 9C has a main front surface S4 that substantially matches an upper surface S6 of the protrusion portion 122. That is to say, the reference surface $S_{REF}$ is positioned on the rear side (left side in the drawing) as compared with the main front surface S4. With respect to the main front surface S4, the operation surface 120 has a recess at a position at which a fingernail is adjacent to the thin switch 130.

Figure 10:
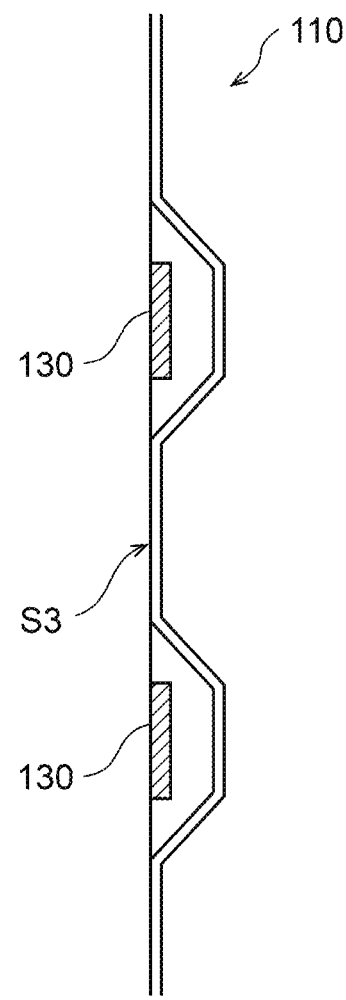
FIG. 10 is a cross-sectional diagram showing an example configuration of the operation panel.

FIG. 10 is a cross-sectional diagram showing an example configuration of the operation panel 110. The thin switch 130 is configured as the capacitive switch 140, which is provided on the main front surface S3 of a housing of the electrical appliance 100. The operation surface 120 having an uneven structure is provided such that it covers the main front surface S3. This arrangement can be regarded as an embodiment shown in FIG. 9B.

Embodiment 2

Figure 11:
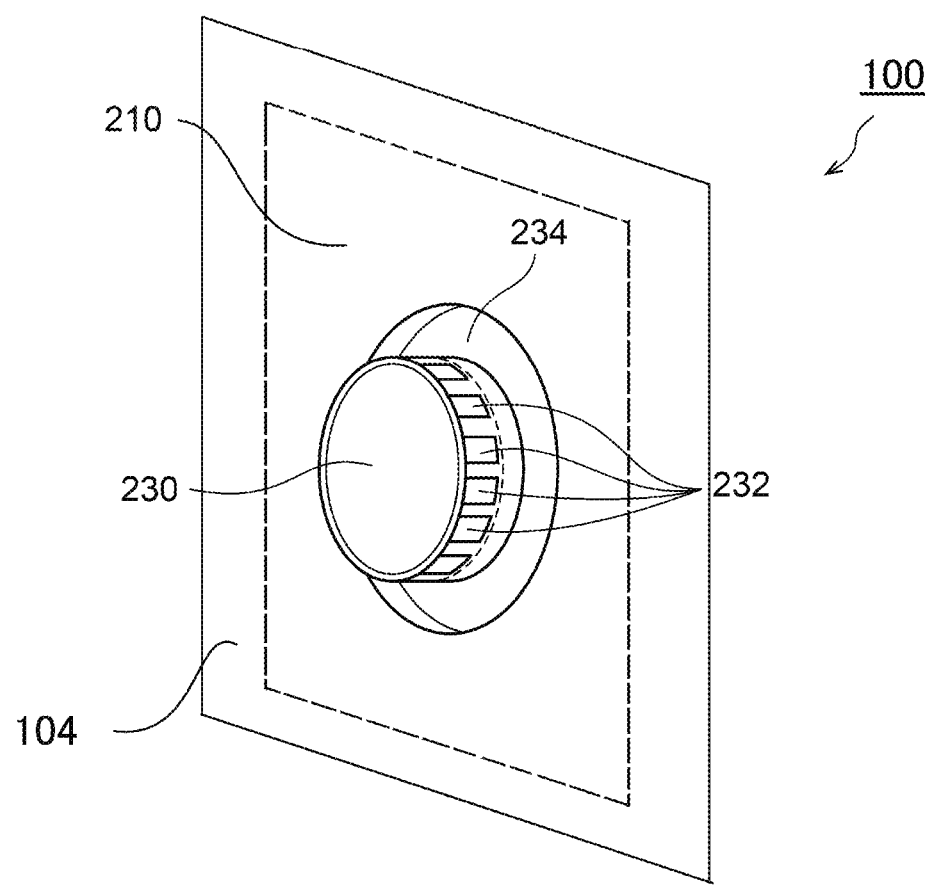
FIG. 11 is a perspective diagram showing an operation panel according to an embodiment 2.
Figure 12:
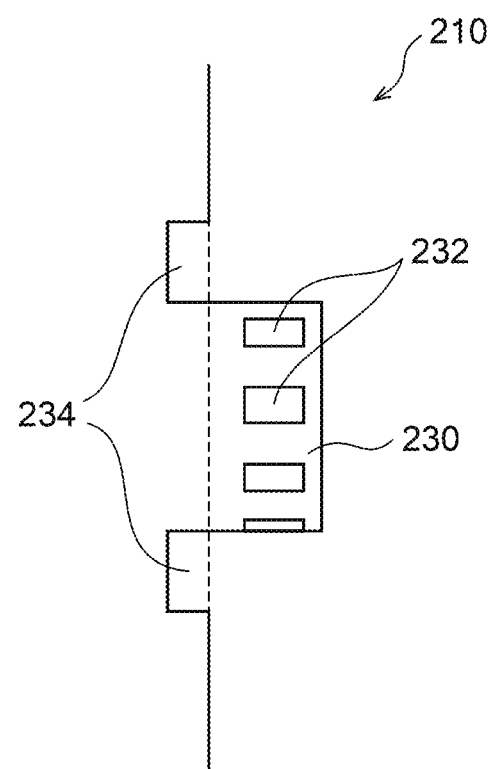
FIG. 12 is a cross-sectional diagram of the operation panel shown in FIG. 11.

FIG. 11 is a perspective diagram showing an operation panel 210 according to an embodiment 2. The operation panel 210 has a function for providing a pseudo rotary switch. FIG. 12 is a cross-sectional diagram of the operation panel 210 shown in FIG. 11. In FIG. 12, the left side corresponds to the main body of the electrical appliance 100, and the right side corresponds to a space where the user is.

The operation panel 210 includes a base member 230, multiple electrodes 232, and a recess portion 234. The base member 230 is arranged such that it protrudes from a vertical surface 104 of the electrical appliance 100. FIG. 11 shows an arrangement in which the base member 230 has a cylindrical shape having a bottom surface that is parallel to the vertical surface 104. The base member 230 may be provided such that it protrudes and tilts from the vertical surface 104. Also, the base member 230 may have a truncated cone shape. The multiple electrodes 232 are arranged at circumferential intervals on a side surface of the base member 230. The region in which the multiple electrodes 232 are provided will be referred to as a "touch region". The recess portion 234 is formed on the vertical surface 104 such that it corresponds to the touch region of the base member 230. In this example, the recess portion 234 is configured as a groove formed such that it surrounds the cylindrical base member 230.

When the user slides a finger along the side surface of the base member 230, the electrode in contact with the finger is switched and changes. An unshown detection circuit detects which electrode from among the multiple electrodes 232 has a touch input, thereby enabling judgment of the input to the rotary switch.

With this arrangement, when a user with long fingernails slides a finger along the side surface of the base member 230, the tip of the fingernail is positioned in the recess portion 234, which allows a sensation of discomfort to be reduced.

Figure 13:
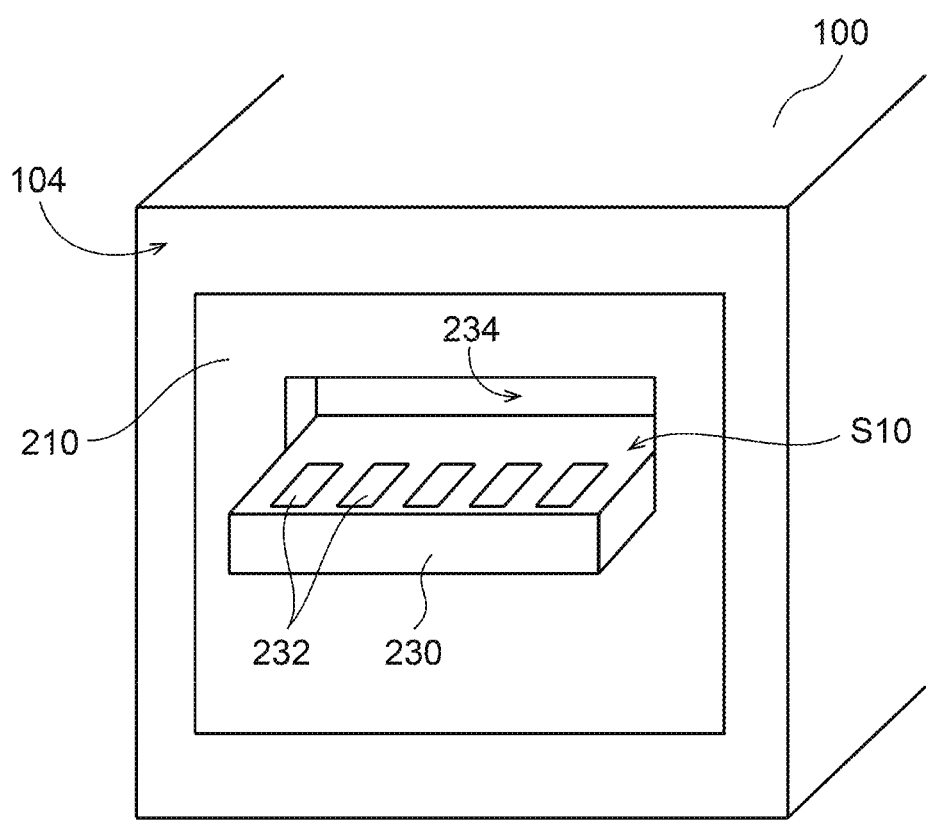
FIG. 13 is a perspective diagram showing an operation panel according to a modification.

FIG. 13 is a perspective diagram showing the operation panel 210 according to a modification. In the modification, the base member 230 has a flat surface S10. Multiple electrodes 232 are provided and arranged in the touch region of the surface S10 at intervals in the horizontal direction. The recess portion 234 is formed in the vertical surface 104 such that it corresponds to the touch region of the base member 230.

Description has been made regarding the present disclosure with reference to the embodiments using specific terms. However, the above-described embodiments show only the mechanisms and applications of the present disclosure and/ or the present invention. Rather, various modifications and various changes in the layout can be made without departing from the spirit and scope of the present invention defined in appended claims.

What is claimed is:

1. An electrical appliance comprising:
   a vertical surface; and
   an operation panel provided on the vertical surface, wherein the operation panel comprises:
   an operation surface having an uneven structure; and
   a switch provided on a protrusion portion of the operation surface, wherein, with a length of a fingernail of a user as A, with a thickness of a finger as B, and with an angle defined between the finger and the vertical surface as f, a depth d of the uneven structure satisfies $d>(A-B/\tan f)\times\sin f$,
   wherein a touch portion of the switch is provided on a slope surface of the protrusion portion.

2. The electrical appliance according to claim 1, wherein a bottom surface of a recess portion of the uneven structure is aligned with a main front surface of the electrical appliance.

3. The electrical appliance according to claim 1, wherein a top surface of a protrusion portion of the uneven structure is aligned with a main front surface of the electrical appliance.

4. The electrical appliance according to claim 1, wherein a touch portion of the switch is provided on a top surface of the protrusion portion.

5. The electrical appliance according to claim 1, wherein the switch is structured as a capacitive switch having a sense electrode embedded on a back side of the operation surface.

6. The electrical appliance according to claim 1, wherein $d>1.23$ mm.

7. An electrical appliance comprising:
   a vertical surface; and
   an operation panel provided on the vertical surface, wherein the operation panel comprises:
   a base member provided such that it protrudes from the vertical surface;
   a plurality of electrodes arranged at intervals in a touch region on a side surface of the base member; and
   a recess portion formed in the vertical surface such that it corresponds to the touch region of the base member, wherein, with a length of a fingernail as A, with a thickness of a finger as B, and with an angle defined between the finger and the vertical surface as f, a depth d of the recessed portion satisfies $d>(A-B/\tan f)\times\sin f$.

8. The electrical appliance according to claim 7, wherein $d>1.23$ mm.

* * * * *